(12) United States Patent
Gopalraja et al.

(10) Patent No.: US 6,461,483 B1
(45) Date of Patent: Oct. 8, 2002

(54) METHOD AND APPARATUS FOR PERFORMING HIGH PRESSURE PHYSICAL VAPOR DEPOSITION

(75) Inventors: Praburam Gopalraja, Sunnyvale; Bradley O. Stimson, San Jose; John C. Forster, San Francisco; Wei Wang, Cupertino, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/523,333

(22) Filed: Mar. 10, 2000

(51) Int. Cl.[7] .......................... C23C 14/32; C23C 14/33
(52) U.S. Cl. .................. 204/192.12; 204/192.17; 204/298.23; 204/298.29; 204/298.06; 204/298.07; 204/298.08
(58) Field of Search ................ 204/192.12, 192.17, 204/298.23, 298.29, 298.06, 298.07, 298.08

(56) References Cited

U.S. PATENT DOCUMENTS

| | | | | |
|---|---|---|---|---|
| 5,635,036 A | * | 6/1997 | Demaray et al. | 204/192.12 |
| 5,725,739 A | | 3/1998 | Hu | 204/192.3 |
| 5,783,282 A | * | 7/1998 | Leiphart | 204/192.17 |
| 5,830,327 A | * | 11/1998 | Kolenkow | 204/192.12 |
| 5,830,330 A | * | 11/1998 | Lantsman | 204/192.12 |
| 5,961,793 A | * | 10/1999 | Ngan | 204/192.12 |
| 6,156,164 A | * | 12/2000 | Smolanoff et al. | 204/192.12 |

OTHER PUBLICATIONS

Vacuum Technology, Thin films, and Sputtering (R. V. Stuart), Sputtering, pp. 96–99, 1983.*

* cited by examiner

Primary Examiner—Mark F. Huff
Assistant Examiner—Daborah Chacko-Davis
(74) Attorney, Agent, or Firm—Moser, Patterson & Sheridan LLP

(57) ABSTRACT

A method and apparatus that operates at a high pressure of at least one torr for improving sidewall coverage within trenches and vias in a substrate. The apparatus comprises a chamber enclosing a target and a pedestal, a process gas that provides a process gas in the chamber, a pump for maintaining the high pressure of at least about one torr in the chamber and a power source coupled to the target. Additionally, the distance between the target and the substrate is set to ensure that collisions between the sputtered particles and the plasma occur in the trenches and vias on the substrate. The method comprises the steps of providing a process gas into the chamber such that the gas pressure is at least about one torr, generating a plasma from the process gas, and sputtering material from the target.

22 Claims, 2 Drawing Sheets

METHOD AND APPARATUS FOR PERFORMING HIGH PRESSURE PHYSICAL VAPOR DEPOSITION

BACKGROUND OF THE INVENTION

1. Field of the Invention

The invention relates to a system for performing physical vapor deposition. More particularly, the invention relates to a method and apparatus for performing high pressure physical vapor deposition.

2. Description of the Background Art

Semiconductor wafer processing systems that perform physical vapor deposition are used for filling trenches and vias with material. When the material is a metal, the filled trenches and vias form interconnect structures between integrated circuit components.

One problem in physical vapor deposition (PVD) systems is that the sputtered particles (atoms) do not always adequately fill a trench or via that is formed in a substrate. Within the feature (trench or via), the sputtered particles deposit along the bottom but unevenly deposit along the sidewalls. As such, the sputtered particles accumulate near the substrate surface before completely filling the feature. If these features are inadequately filled such that voids are formed, then the interconnect structures are defective and generally useless.

Therefore, there is a need to provide a PVD method and apparatus that improves the sidewall coverage of sputtered particles.

SUMMARY OF THE INVENTION

This invention provides a method and apparatus for forming void-free interconnects between conducting layers, including apertures such as contacts or vias in high aspect ratio sub-quarter micron applications. The method and apparatus improves the sidewall coverage in physical vapor deposition (PVD) systems. Specifically, the invention comprises a chamber enclosing a target and a substrate. The substrate is supported on a pedestal within the chamber and a sputtering gas is introduced into the chamber. The gas is infused with energy to produce a plasma that sputters the target material onto the substrate.

To facilitate uniform sidewall deposition, the gas pressure in the chamber is substantially higher than the pressure normally used in PVD, and is at least about one torr. To further enhance uniform sidewall deposition, the distance between the target and the substrate is no more than about 50 mm, significantly less than the distance normally found in PVD deposition, such that a substantially larger number of collisions between the sputtered particles and atoms of the plasma occur within the features on the substrate.

A method for sputtering particles from a target onto the substrate having a high aspect ratio feature is also provided. The method comprises the steps of maintaining a relatively high gas pressure within a chamber and sputtering material from the target such that particles sputtered from the target collide with atoms of a plasma within the feature to enhance sidewall deposition.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

In the method of this invention, adequate sidewall coverage of a feature by PVD is obtained by modifying the trajectory of the sputtered particles so that they have a much greater tendency to uniformly coat the sidewalls and bottom of the aperture. The sputtering gas pressure is increased, thereby increasing the density of gas atoms of the plasma, providing more gas atoms and ions for collision with the sputtered particles. Also, the target is moved closer to the substrate, increasing the likelihood that the sputtered particles will collide with gas atoms inside the features.

Figure 1:
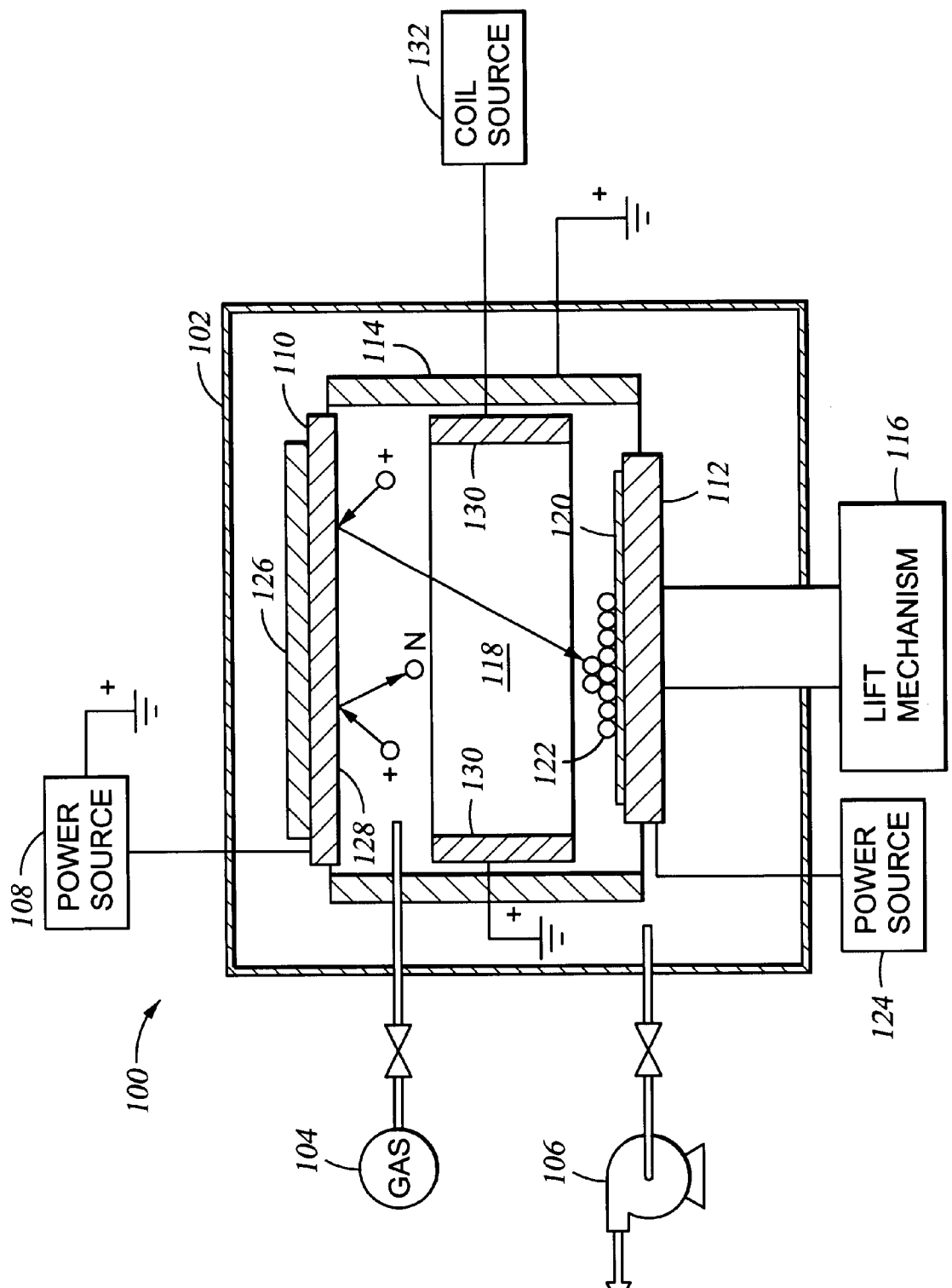
FIG. 1 depicts a cross-sectional view of a sputtering-type physical vapor deposition (PVD) system.

FIG. 1 depicts a schematic, cross-sectional view of a sputtering-type physical vapor deposition (PVD) system 100. The PVD system 100 comprises a chamber 102, a gas source 104, a pump system 106 and a target power source 108. The chamber 102 encloses a target 110, a substrate 120 on a vertically movable pedestal 112, and a shield 114 enclosing the reaction zone 118. A lift mechanism 116 is coupled to the pedestal 112 to position the pedestal 112 relative to the target 110.

The chamber 102 is a vacuum chamber that encloses the sputtering reaction of the PVD system 100. The gas source 104 supplies a process gas into the chamber 102. The process gas generally includes argon (Ar) or some other inert gas. The pump system 106 controls the pressure within the chamber 102.

The target 110 is typically suspended from the top of the chamber 102. The target 110 includes a material that is sputtered during operation of the PVD system 100. Although the target 110 may comprise, as a material to be deposited, an insulator or semiconductor, the target 110 generally comprises a metal such as Titanium (Ti), Tungsten (W), Aluminum (Al), or Copper (Cu).

The pedestal 112 supports the substrate 120 within the chamber 102. The pedestal 112 is generally disposed at a fixed distance from the target 110. The pedestal 112 is supported by the lift mechanism 116, which moves the 112 along a range of vertical motion within the chamber 102.

The PVD system 100 may comprise additional components for improving the deposition of sputtered particles onto the substrate 104. For example, the PVD system 100 may include an additional bias power source 124 for biasing the substrate 120. The power source 124 is coupled to the pedestal 112 for controlling the deposition of the film 122 onto the substrate 120. The power source 124 is typically an AC source having a frequency of, for example, about 400 kHz.

The PVD system 100 may also comprise a magnet 126 or magnetic sub-assembly positioned behind the target 110 for creating a magnetic field proximate to the target 110. The PVD system 100 may also comprise a coil 130 proximately disposed within the shield 114, but between the target 110 and the substrate 112. The coil 130 may comprise either a single-turn coil or multi-turn coil that, when energized, ionizes the sputtered particles. The process is known as Ion Metal Plasma (IMP) deposition. The coil 130 is generally connected to an AC source 132 having a frequency of, for example, about 2 MHz.

The target power source 108 that is used to infuse the process gas with energy may comprise a DC source, a radio frequency (RF) source or a DC-pulsed source. Applying either DC or RF power in this manner creates an electric field in the reaction zone 118. The electric field ionizes the process gas in the reaction zone 118 to form plasma comprising process gas ions, electrons and (neutral) process gas atoms. The target power source 108 is coupled to the target 110 and the shield 114 is grounded. If the target power source 108 is DC or DC-pulsed, then the target 110 forms a negatively biased cathode and the shield 114 is a grounded anode. If the target power source 108 is an RF source, then the shield 114 is typically grounded and the voltage at the target 110 varies relative to the shield 114 at a radio frequency, typically 13.56 MHz. In this case, electrons in the plasma accumulate at the target 110 to create a self-bias voltage that negatively biases the target 110.

Additionally, the. electric field accelerates the process gas ions toward the target 110 for sputtering target particles from the target 110. If electrons in the plasma collide into the sputtered target particles, these target particles become ionized.

This configuration enables deposition of sputtered and ionized target particles from the target 110 onto the substrate 120 to form a film 122 thereon. The shield 114 confines the sputtered particles and non-reactant gas in a reaction zone 118 within the chamber 102. As such, the shield 114 prevents deposition of target particles in unwanted locations, for example, beneath the pedestal 112 or behind the target 110.

Once the bias power source 124 is applied, electrons in the plasma quickly accumulate to the substrate, creating a negative DC offset on the substrate 120 and the pedestal 112. The negative bias at the substrate 120 attracts sputtered target particles that become ionized. The target particles are generally attracted to the substrate 120 in a direction that is substantially orthogonal to the substrate.

As such, the bias power source 124 enhances deposition of target particles over an unbiased substrate 120.

To improve the coverage of distribution of sputtered target material along the sidewalls within a substrate via or trench, the pump system 106 maintains a high gas pressure, preferably at least about one torr (1000 millitorr), a pressure substantially greater than conventionally used in PVD. The high gas pressure increases the density of the process gas atoms in the plasma, and as a result increases the number of collisions between the process gas atoms and ions and the sputtered target particles. Additionally, the separation distance between the target 110 and substrate 120 is minimal, preferably no more than about 50 millimeters. The close proximity between the target 110 and the substrate 120 minimizes the possibility of these collisions within the reaction zone while maximizing the collisions that occur within the trenches and vias on the substrate 120. The collisions of the sputtered target particles with the process gas atoms and ions within the via or trench redirects the target particles toward the sidewalls, thereby increasing the rate of deposition of the target material on the sidewalls.

The process as described above may be controlled by one of any form of general purpose computer processor that can be used in an industrial setting for controlling various chambers and sub-processors. The computer may use any suitable memory, such as random access memory, read only memory, floppy disk drive, hard disk, or any other form of digital storage, local or remote. Various support circuits may be coupled to the CPU for supporting the processor in a conventional manner. Software routines as required may be stored in the memory or executed by a second CPU that is remotely located.

The software routines are executed after the substrate is positioned on the pedestal. The software routine, when executed, transforms the general purpose computer into a specific process computer that controls the chamber operation so that the deposition process is performed. Alternatively, the process of the present invention may be performed in hardware, as an application specific integrated circuit or other type of hardware implementation, or a combination of software and hardware.

Figure 2:
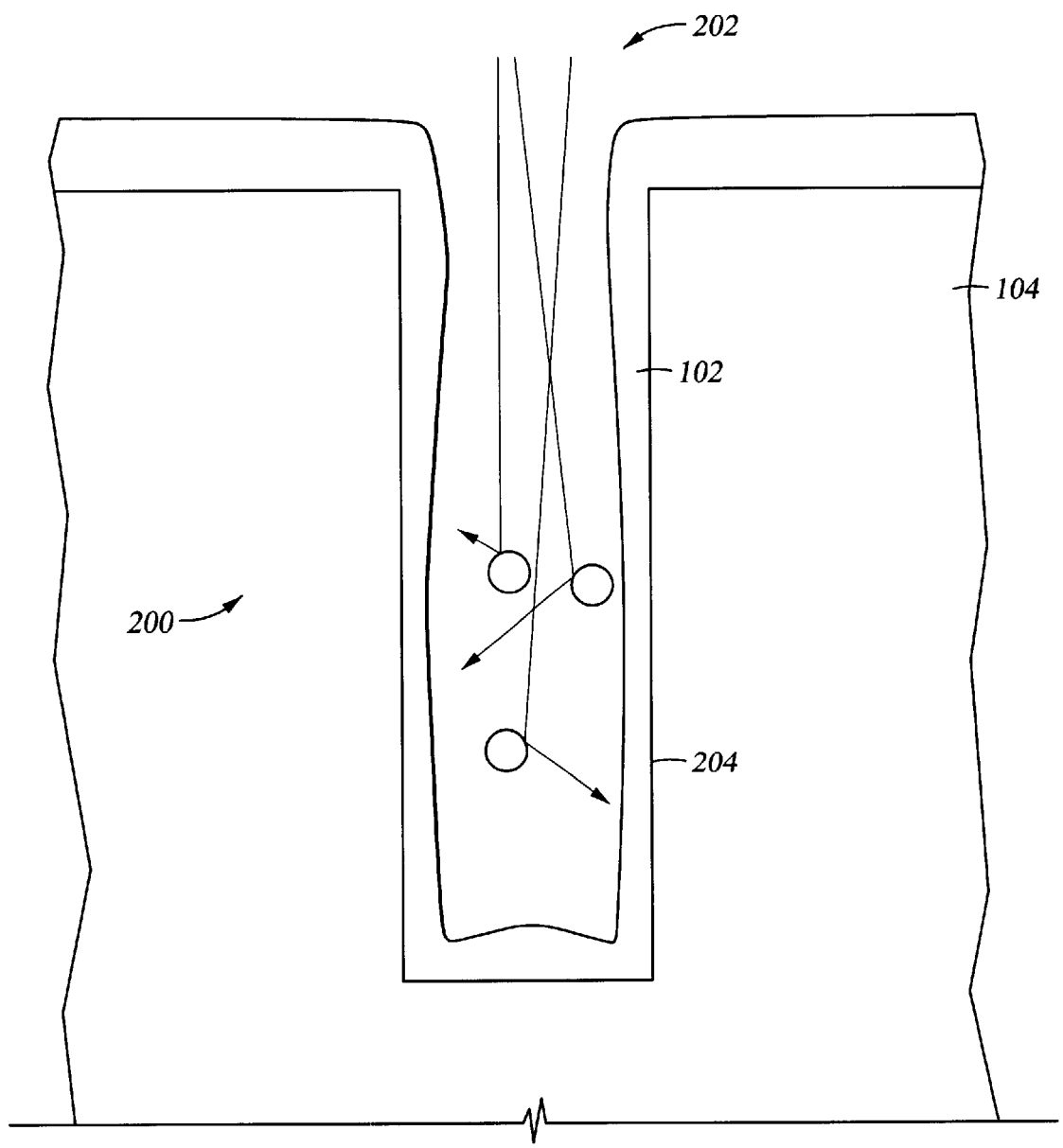
FIG. 2 depicts a cross-sectional view of a film deposited onto a feature within the substrate using the PVD system depicted in FIG. 1.

FIG. 2 depicts a cross sectional view of a film 122 deposited into a trench 202 formed on the substrate 120 using the PVD system 100 depicted in FIG. 1. The target particles collide with the process gas atoms and are redirected to the sidewalls 206 of the trench 202. As such, the film 122 is uniformly distributed along the sidewalls 206 such that other particles may adequately fill the trench 202.

The inventive feature may be incorporated in various types of PVD systems. For example, one embodiment of the invention may include RF biasing or DC-pulsing the target. Another embodiment of the invention may include DC-biasing the target, while RF biasing the substrate at the pedestal. Still another embodiment may include DC-biasing the target with AC powered coils. Other variations are also possible and are contemplated within the scope of the invention.

Although various embodiments which incorporate the teachings of the present invention have been shown and described in detail herein, those skilled in the art can readily devise many other varied embodiments that still incorporate these teachings.

What is claimed is:

1. Apparatus for depositing material, comprising:
    a chamber enclosing a target and a pedestal;
    a process gas source coupled to the chamber;
    a pump for maintaining a gas pressure in the chamber of at least about one torr;
    a power source coupled to the target; and
    a controller programmed to control devices to provide a process gas pressure of at least about one torr in the chamber.

2. The apparatus of claim 1, wherein the target and a substrate are separated by less than about 50 millimeters.

3. The apparatus of claim 1, wherein the pedestal and target are separated by a distance that causes a plasma of process gas to interact, within features of a substrate, with particles sputtered from the target.

4. The apparatus of claim 3, wherein the number of particles interacting with the plasma within a feature of the substrate is sufficient to cause substantially uniform coating of the sidewalls of the feature by the particles.

5. Apparatus for depositing material, comprising:
    a chamber enclosing a target and a pedestal;
    a process gas source coupled to the chamber;
    a pump for maintaining a gas pressure in the chamber of at least one torr;
    a power source coupled to the target; and
    a bias power source coupled to the pedestal;
    the pedestal and target being separated by a distance that causes a plasma of process gas to interact with particles sputtered from the target within features on a substrate that is supported in the chamber upon the pedestal.

6. The apparatus of claim 5, wherein the target and the substrate are separated by less than about 50 millimeters.

7. The apparatus of claim 5, further comprising a coil power source coupled to a coil positioned between the target and pedestal.

8. A method for sputtering particles from a target onto a substrate comprising:

providing a process gas to a chamber to produce a pressure in the chamber that is greater than one torr;

generating a plasma of the process gas; and sputtering material from the target.

9. The method of claim 8 further comprising positioning the substrate from the target by less than about 50 millimeters.

10. The method of claim 8, further comprising positioning the substrate from the target at a distance that causes the plasma to interact with a substantial proportion of the particles within features on the substrate.

11. The method of claim 10, further comprising positioning the substrate a distance from the target to cause the number of particles interacting with the plasma within a feature of the substrate to be sufficient to cause substantially uniform coating of the sidewalls of the feature by the particles.

12. The method of claim 8, wherein the process gas is argon.

13. The method of claim 8, wherein the target comprises titanium, tungsten, aluminum, or copper.

14. The method of claim 8, wherein the sputtering further comprises ionizing the particles being sputtered.

15. The method of claim 14, wherein the ionizing the particles further comprises energizing a coil coupled to an alternating current source wherein the coil is disposed between the target and the substrate.

16. A method for sputtering particles from a target onto a substrate comprising:

providing a process gas to a chamber containing the target and a pedestal for supporting the substrate;

maintaining a gas pressure within the chamber of at least about one torr;

generating a plasma of the process gas; and sputtering particles from the target, whereby at least some atoms of the process gas collide with some of the particles;

wherein the pressure of the process gas and the distance between the target and substrate being selected so that the number of particles interacting with plasma atoms within a feature of the substrate is sufficient to cause substantially uniform coating of the sidewalls of the feature by the particles.

17. The method of claim 16, wherein the distance between the target and substrate is less than about 50 millimeters.

18. The method of claim 16, wherein the process gas is argon.

19. The method of claim 16, wherein the target comprises titanium, tungsten, aluminum, or copper.

20. The method of claim 16, wherein the sputtering further comprises ionizing the particles being sputtered.

21. The method of claim 20, wherein the ionizing the particles further comprises energizing a coil coupled to an alternating current source wherein the coil is disposed between the target and the substrate.

22. A method for sputtering particles from a target onto a substrate having features thereon comprising:

spacing a sputterable surface no more than about 50 millimeters from the substrate;

providing a process gas to a chamber containing the target and having a chamber pressure of at least about one torr;

generating a plasma of the process gas;

sputtering particles of material from the target; and biasing the target and the substrate to cause at least some of the particles to strike the features of the substrate;

wherein the pressure of the process gas and the distance between the target and the substrate being selected so that the number of particles interacting with plasma atoms within a feature of the substrate is sufficient to cause substantially uniform coating of the sidewalls of the feature by the particles.

* * * * *

UNITED STATES PATENT AND TRADEMARK OFFICE
CERTIFICATE OF CORRECTION

PATENT NO.     : 6,461,483 B1                                           Page 1 of 1
DATED          : October 8, 2002
INVENTOR(S)    : Praburam Gopalraja et al.

It is certified that error appears in the above-identified patent and that said Letters Patent is hereby corrected as shown below:

<u>Column 2,</u>
Line 48, please add -- pedestal -- before "112".

<u>Column 3,</u>
Line 55, please add -- 118, -- after "reaction zone".

<u>Column 5,</u>
Line 20, please change "10" to -- 8 --.
Line 32, please add -- of -- after "ionizing".

<u>Column 6,</u>
Line 11, please change "distance" to -- spacing --.
Line 19, please add -- of -- after "ionizing".
Line 26, please delete the bolding on "50".

Signed and Sealed this

Eighth Day of April, 2003

JAMES E. ROGAN
*Director of the United States Patent and Trademark Office*